United States Patent [19]

Hawkins et al.

[11] Patent Number: 5,010,355
[45] Date of Patent: Apr. 23, 1991

[54] INK JET PRINTHEAD HAVING IONIC PASSIVATION OF ELECTRICAL CIRCUITRY

[75] Inventors: William G. Hawkins, Webster; Cathie J. Burke, Rochester; Daniel O. Roll, Fishers; Pamela J. Hartman, Hilton; Diane Atkinson, Marion, all of N.Y.

[73] Assignee: Xerox Corporation, Stamford, Conn.

[21] Appl. No.: 456,431

[22] Filed: Dec. 26, 1989

[51] Int. Cl.⁵ .......................... B41J 2/34; H01L 21/00
[52] U.S. Cl. .................................... 346/140 R; 346/75
[58] Field of Search .......................... 346/140, 1.1, 75; 357/54; 427/39

[56] References Cited

U.S. PATENT DOCUMENTS

| Re. 32,572 | 1/1988 | Hawkins et al. | 156/626 |
|---|---|---|---|
| 4,298,629 | 11/1981 | Nozaki et al. | 427/39 |
| 4,463,359 | 7/1984 | Ayata et al. | 346/1.1 |
| 4,638,337 | 1/1987 | Torpey et al. | 346/140 R |
| 4,647,472 | 3/1987 | Hiraki et al. | 427/39 |
| 4,686,559 | 8/1987 | Haskell | 357/54 |
| 4,699,825 | 10/1987 | Sakai | 428/337 |
| 4,719,477 | 1/1988 | Hess | 346/140 |
| 4,774,530 | 9/1988 | Hawkins | 346/140 R |

FOREIGN PATENT DOCUMENTS

61-135755  6/1986  Japan .
61-291149  12/1986  Japan .

*Primary Examiner*—Benjamin R. Fuller
*Assistant Examiner*—Alrick Bobb
*Attorney, Agent, or Firm*—Robert A. Chittum

[57] ABSTRACT

An improved ink jet printhead is disclosed of the type having a plurality of parallel ink flow channels which terminate with an ink droplet emitting nozzle, a heating element with a cavitational protective layer thereover located in each channel, and MOS electronic circuitry monolithically integrated within the printhead for applying electrical pulses to the heating elements. The pulsed heating elements produce bubbles momentarily on the protective layer of the heating elements which expel ink droplets from the nozzles. The improvement is obtained by providing multi-layer ionic passivation of the MOS electronic circuitry which is exposable to the ink. This is accomplished through the deposition of a multi-layered, thin film insulative coating thereon consisting of a first layer of doped or undoped silicon dioxide having a thickness of 200 Å to 2 μm followed by a second layer of plasma nitride having a thickness of 1000 Å to 3 μm. The silicon nitride is etched from the protective layers of the heating elements and electrical contact pads for external connection to electrical power so that the first layer of silicon oxide is exposed, followed by etching of the silicon oxide to remove it from the protective layer and contact pads. Thus, the MOS circuitry is protected from mobile ions in the ink while the cost effective fabrication of a printhead is maintained. In an alternate embodiment, the multi-layered ionic passivation comprises three thin film layers comprising polyimide interfacing with the ink, followed by silicon nitride, and doped or undoped silicon dioxide directly interfacing with the metallization.

6 Claims, 4 Drawing Sheets

INK JET PRINTHEAD HAVING IONIC PASSIVATION OF ELECTRICAL CIRCUITRY

BACKGROUND OF THE INVENTION

1. Field of the Invention

This invention relates to an improved thermal ink jet printhead, and more particularly to a two part thermal ink jet printhead in which one part contains the ink flow directing channels, nozzles, and ink supplying reservoir, and the other part contains on a surface thereof the heating elements and ionicly passivated electronic driving circuitry therefor.

2. Description of the Prior Art

The printhead of U.S. Pat. No. 4,463,359 to Ayata et al discloses one or more ink-filled channels which are replenished by capillary action. A meniscus is formed at each nozzle to prevent ink from weeping therefrom. A resistor or heater is located in each channel upstream from the nozzles. Current pulses representative of data signals are applied to the resistors to momentarily vaporize the ink in contact therewith and form a bubble for each current pulse. Ink droplets are expelled from each nozzle by the growth and collapse of the bubbles.

U.S. Pat. Re. No. 32,572 to Hawkins et al discloses several fabricating processes for ink jet printheads, each printhead being composed of two parts aligned and bonded together. One part is substantially a flat substrate which contains on the surface thereof a linear array of heating elements and addressing electrodes, and the second part is a substrate having at least one recess anisotropically etched therein to serve as an ink supply manifold when the two parts are bonded together. A linear array of parallel grooves are formed in the second part, so that one end of the grooves communicate with the manifold recess and the other ends are open for use as ink droplet expelling nozzles. Many printheads can be simultaneously made by producing a plurality of sets of heating element arrays with their addressing electrodes on, for example, a silicon wafer and by placing alignment marks thereon at predetermined locations. A corresponding plurality of sets of channels and associated manifolds are produced in a second silicon wafer and, in one embodiment, alignment openings are etched thereon at predetermined locations. The two wafers are aligned via the alignment openings and alignment marks and then bonded together and diced into many separate printheads. A number of printheads can be fixedly mounted on a pagewidth configuration which confronts a moving recording medium for pagewidth printing or individual printheads may be adapted for carriage type ink jet printing. In this patent, the parallel grooves, which are to function as the ink channels when assembled, are individually milled as disclosed in FIG. 6B or anisotropically etched concurrently with the manifold recess. In this latter fabrication approach, the grooves must be opened to the manifold; either they must be diced open as shown in FIGS. 7 and 8, or an additional isotropic etching step must be included.

U.S. Pat. No. 4,638,337 to Torpey et al discloses an improved thermal ink jet printhead similar to that of Hawkins et al, but has each of its heating elements located in a recess. The recess walls containing the heating elements prevent the lateral movement of the bubbles through the nozzle and therefore the sudden release of vaporized ink to the atmosphere, known as blowout, which causes ingestion of air and interruption of the printhead operation. In this patent, a thick film organic structure such as Riston ® is interposed between the heater plate and the channel plate. The purpose of this layer is to have recesses formed therein directly above the heating elements to contain the bubble which is formed over the heating element to enable an increase in droplet velocity without the occurrent of vapor blowout.

U.S. Pat. No. 4,774,530 to Hawkins discloses an improved ink jet printhead which comprises an upper and a lower substrate that are mated and bonded together with a thick insulative layer sandwiched therebetween. One surface of the upper substrate has etched therein one or more grooves and a recess which, when mated with the lower substrate, will serve as capillary-filled ink channels and ink supplying manifold, respectively. The grooves are open at one end and closed at other end. The open ends will serve as the nozzles. The manifold recess is adjacent the groove closed ends. Each channel has a heating element located upstream of the nozzle. The heating elements are selectively addressable by input signals representing digitized data signals to produce ink vapor bubbles. The growth and collapse of the bubbles expel ink droplets from the nozzles and propel them to a recording medium. Recesses patterned in the thick layer expose the heating elements to the ink, thus placing them in a pit, and provide a flow path for the ink from the manifold to the channels by enabling the ink to flow around the closed ends of the channels, thereby eliminating the fabrication steps required to open the groove closed ends to the manifold recess, so that the printhead fabrication process is simplified.

U.S. Pat. No. 4,647,472 to Hiraki et al discloses a semiconductor device having an improved protective film and a process for producing it. The surface of a typical planar semiconductor device is covered with a protective film of an amorphous or polycrystalline silicon carbide which includes as an impurity at least one element selected from the group consisting of hydrogen, nitrogen, oxygen and a halogen. The protective film is formed by plasma CVD, propane, and a small amount of nitrogen monoxide, or it is formed by reduced pressure CVD with a reaction temperature of 800° C. or more. In another embodiment, an additional insulating layer is formed over the protective film to increase the semiconductor device's ability to withstand voltage. This second insulating layer material may be $Al_2O_3$, $Si_3N_4$, $Nb_2O_3$, $HfO_2$, $Ta_2O_3$ or a low melting glass.

U.S. Pat. No. 4,686,559 to Haskell discloses a method of hermetically sealing an integrated circuit with a silicon nitride layer which is deposited directly on the surface to be sealed, followed by a second protective oxide layer. The nitride and oxide layers are concurrently patterned to expose the metallization for electrical contact. This results in a thinner nitride layer and an elimination of an entire set of masking, developing, and etching steps. The nitride layer should be 2000 to 6000 Å, and is deposited at a temperature of 300° to 450° C.

U.S. Pat. No. 4,699,825 to Sakai et al discloses a method of forming a silicon nitride film on a plurality of silicon wafers using a low pressure CVD process in which the wafer diameter may range from 100 to 150 mm while maintaining a relatively uniform film thickness. The CVD process is carried out under a pressure of 0.05 to 0.25 Torr and at a temperature ranging from 650° to 1000° C.

U.S. Pat. No. 4,298,629 to Nozaki et al discloses a gas plasma of a nitrogen-containing gas generated in a direct nitridation reaction chamber with the silicon body heated to a temperature of 800° to 1300° C. within the gas plasma to form a silicon nitride film on the silicon body. The resulting silicon-nitride film has a dense structure and low oxygen concentration than the prior art lower temperature process and a thick film is formed in a shorter period of time.

Japanese Laid-Open No. 61-135755 and published without examination on Jun. 23, 1986 to Watanabe discloses a thermal ink jet printhead having an array of heating elements and addressing electrodes formed on a substrate. The electrodes and heating elements are covered by a $SiO_2$ layer. A light curable photosensitive layer is patterned and developed to form flow passage walls, and a glass plate is adhered to the walls to produce the printhead having a plurality of droplet emitting ink channels.

Japanese Laid-Open No. 61-291149 and published without examination on Dec. 20, 1986 to Katano discloses applying a fluorocarbon type water repellent to the ink jet printhead nozzle face. The vicinity of the nozzle face surrounding each nozzle is masked and a surfactant is applied to form an anti-static surface. This prevents adhesion of dust particles to the nozzle face and reduces the ink droplet ejection misdirection.

Printheads in carriage type printers must be reciprocally scanned across a recording medium, such as paper, so that a large number of droplet emitting nozzles requiring one lead per heating element per nozzle causes design and operating difficulty because of the large number of interconnections to the printhead with each of the many leads carrying high current. The necessity of making many interconnections increases printhead size and cost. Even in stationary pagewidth printheads, high lead count of one per nozzle results in an enormous number of leads for 300 pixels or spots per inch (SPI) and the industry is moving towards even higher printing resolution. It is not practical to wire bond pagewidth printers at 300 SPI when each heating element requires an associated wire bond. Thus, lead count reduction is enabling for compact pagewidth or scanning printhead architectures. Therefore, active integration of electronic circuitry on the heating-element-containing substrate to reduce the lead count is very economically attractive for high resolution printing (i.e., printing with a high jet or nozzle count).

There are two types of semiconductor devices which could be used for integration on the part of the printhead containing the heating elements; viz., bipolar and MOS (CMOS or NMOS). Bipolar devices exhibit thermal run away because device transconductance increases with temperature, so that conduction filaments are created, while the scattering mobile carriers from the channel surface of MOS devices degrades transconductance as temperature rises, leading to self shut down or self regulation of current over the total channel width of the device. Therefore, power MOS is inherently more suited for the thermal ink jet power switching application, especially where there is also uneven heating taking place, or where high currents are switched.

Power MOS also has a high switching rate because minority carrier recombination is not required to shut off the device, and it is relatively easy to produce 50 to 100 volt breakdown of drivers. High switching speed is important because the bubble generating resistors must be turned on and off in a few hundred nanoseconds. With bipolar devices, the minority carriers must recombine before turn off occurs. Also, power MOS is cheaper to manufacture and integrate with logic devices because no epitaxial wafer is required. The general industry trend is toward high use of MOS technology.

The single drawback of power MOS is sensitivity to mobile ions such as $Na^+$, $Li^+$, and $K^+$, commonly found in the inks used by thermal ink jet printers. The sensitivity of MOS to ions is caused by the fact that mobile ions exist in $SiO_2$ as charged species which drift under applied electric field, such as those created by a biased gate or metallization layer. The drifting of MOS devices results in unstable logic performance (shifting threshold voltage) and premature breakdown of high voltage devices.

Inks used for thermal ink jet printing have mobile ions as part of the dye species, and in any case, the ink manufacturing process produces inks which are quite impure by the standards of integrated circuits. The fact that the printhead temperature rises to about 60° C. during use is also troublesome because mobile ion drift rate is accelerated by high temperature. Therefore, the electronic circuitry resident in the printhead must be protected from the ink and that is the subject of this invention.

Power MOS devices have increased sensitivity to mobile ions because a drift layer is present which does not have a field plate over it, only silicon oxide. If ions get into the silicon oxide above the drift layer, the field lines in the drift region become distorted. Breakdown will occur as a result of the distortion.

As printheads become more productive and produce more pages per minute, they need to last longer to have lower cost per page printed. Therefore, they need to last longer. Ionic passivation of the integrated electrical circuitry increases the printhead lifetime.

SUMMARY OF THE INVENTION

It is an object of the present invention to provide an improved ink jet printhead having ionic passivation of the electrical circuitry which applies electrical pulses to the printhead's heating element.

In the present invention, an improved ink jet printhead is disclosed of the type having a plurality of parallel ink flow channels, each of which terminate with an ink droplet emitting nozzle at one end and communicate with an ink supplying reservoir at the other end, a heating element with a cavitational protective layer thereover located in each channel a predetermined distance upstream from the nozzle, and MOS electronic circuitry monolithically integrated on the printhead for applying electrical pulses to the heating elements. The heating elements are protected by a separate insulator and metal combination and must have the passivation selectively removed from their surface without attacking the protective layers. The heating elements use a different passivation to improve their thermal efficiency greatly. However, the passivation processing temperature requirements for the heating elements are not compatible with aluminum metallization, so that metallization must be added after the heating element passivation. The pulsed heating elements produce bubbles momentarily on their respective protective layers, and the bubbles expel ink droplets from the nozzles. The improved printhead is obtained by providing ionic passivation of the MOS electronic circuitry and is compatible with the separately optimized heater passivation as disclosed in pending U.S. patent application Ser. No. 354,941, filed May 22, 1989, to Hawkins et al. This is accomplished through the deposition of a multi-layered insulative coating thereon consisting of a first layer of doped or undoped silicon dioxide having a thickness of 200 Å to 2 µm followed by a second layer of plasma nitride having a thickness of 1000 Å to 3 µm. The silicon nitride is dry etched over the protective layers of the heating elements and electrical contact pads for external connection to electrical power to expose the first layer of silicon oxide, followed by wet etching of the silicon oxide to remove it from the protective layer and contact pads. Thus, the MOS circuitry is protected from mobile ions in the ink, while maintaining the cost effective fabrication of a printhead having heating elements with a cavitational protective layer to enhance their life time.

In one embodiment, the ionic passivating multi-layered coating further consists of a third layer of polyimide having a thickness of at least 1.5 µm which is etched from the heating elements and contact pads. The polyimide layer provides additional resistance to ionic contamination and lower electric fields, while providing an insulative layer having excellent adhesion to the plasma nitride.

In another embodiment, the thickness of the polyimide layer is at least 8 µm, so that it also may provide a pit for the heating elements to aid in the suppression of air ingestion during droplet expulsion.

A more complete understanding of the present invention can be obtained by considering the following detailed description in conjunction with the accompanying drawings wherein like index numerals indicate like parts.

DESCRIPTION OF THE PREFERRED EMBODIMENT

Figure 1:
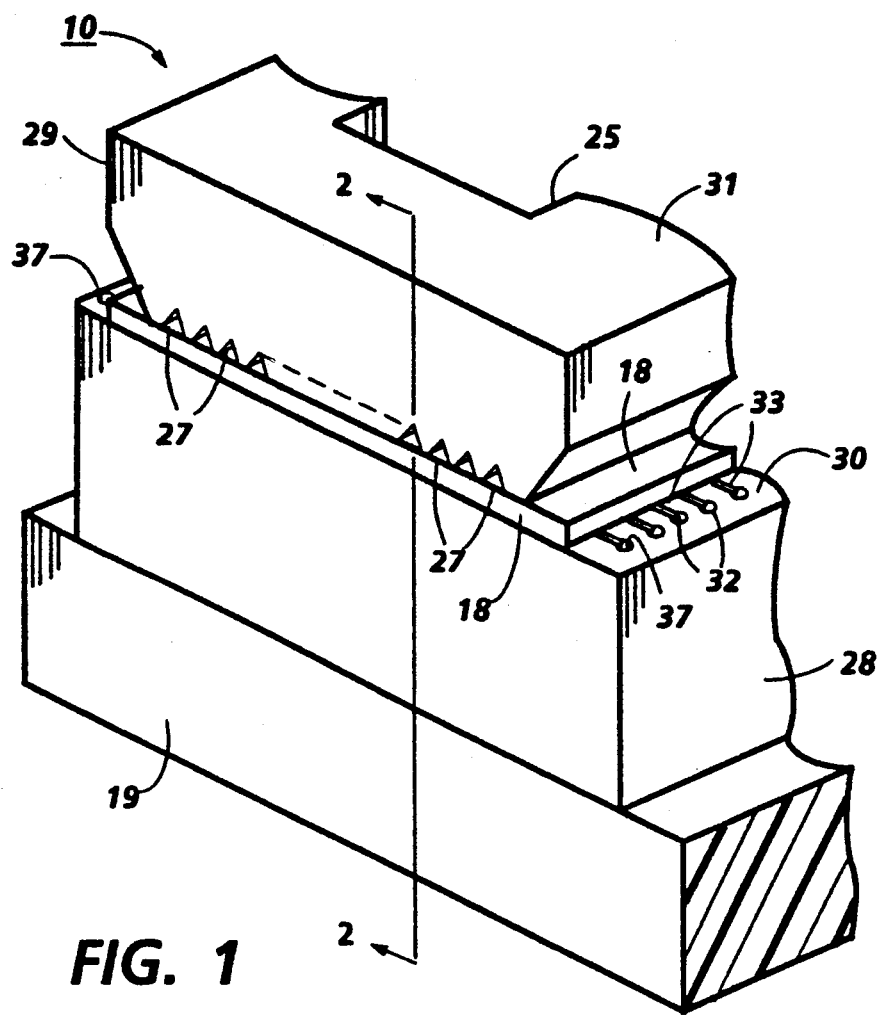
FIG. 1 is an enlarged, partially shown schematic isometric view of a printhead mounted on a daughter board showing the droplet emitting nozzles.
Figure 2:
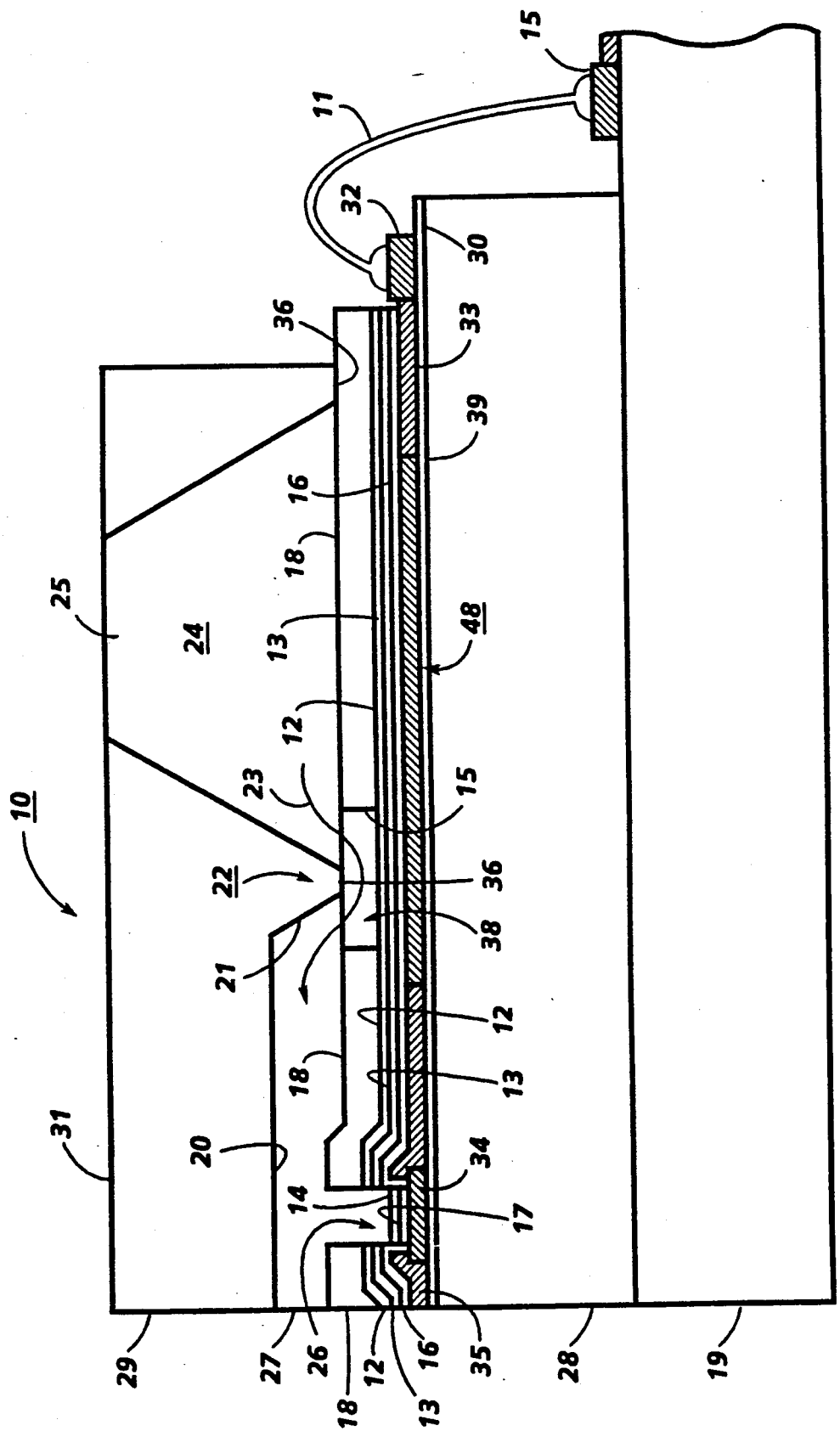
FIG. 2 is an enlarged, cross-sectional view of FIG. 1 as viewed along the line 2—2 thereof and showing the electrode passivation and ink flow path between the manifold and the ink channels and the area where the MOS drivers reside.

An enlarged, schematic isometric view of the front face 29 of the printhead 10 showing the array of droplet emitting nozzles 27 is depicted in FIG. 1. Referring also to FIG. 2, discussed later, the lower electrically insulating substrate or heating element plate 28 has the heating elements or resistors 34, matrix addressing electrodes 33, and MOS drivers 48 (FIG. 4) produced monolithically on surface 30 thereof, while the upper substrate or channel plate 31 has parallel grooves 20 which extend in one direction and penetrate through the upper substrate front face 29. The other end of grooves terminate at slanted wall 21. The through recess 24 is used as the ink supply manifold for the capillary filled ink channels 20 and has an open bottom 25 for use as an ink fill hole. The surface of the channel plate with the grooves are aligned and bonded to the heater plate 28, so that a respective one of the plurality of heating elements 34 is positioned in each channel, formed by the grooves and the lower substrate or heater plate. Ink enters the manifold formed by the recess 24 and the lower substrate 28 through the fill hole 25 and, by capillary action, fills the channels 20 by flowing through an elongated recess 38 formed in the optical thick film insulative layer 18 or other means of providing communication between the manifold 24 and channels 20. The ink at each nozzle forms a meniscus, the surface tension of which prevents the ink from weeping therefrom. The MOS transistor switches or drivers 48 and matrix addressing electrodes 33, a typical scheme of which is shown in FIG. 5, discussed later, are located in an area below the ink in the reservoir 24 and channels 20 of the printhead, so that ionic passivation is imperative. For a typical MOS transistor switch refer to FIG. 4, discussed later, which is the subject matter of co-pending and commonly assigned U.S. patent application Ser. No. 336,624, a continuation application filed on Apr. 7, 1989, to Hawkins et al, entitled "Monolithic Silicon Integrated Circuit Chip for a Thermal Ink Jet Printer". The matrix addressing electrodes 33 and common return 35 on the lower substrate or channel plate 28 provide interconnection of the MOS driver's source and gate with the electrical signals from the printhead controller (not shown) via terminals 32, 37. The upper substrate or channel plate 31 is smaller than that of the lower substrate in order that the electrode terminals 32, 37 are exposed and available for connecting the electrodes 15 on the daughter board 19, by wire bonds 11, on which the printhead 10 is permanently mounted. The daughterboard electrodes are connected to the printhead controller. Optional layer 18 is a thick film passivation layer, discussed later, sandwiched between upper and lower substrates. This layer is etched to expose the heating elements, thus placing them in a pit 26, and is etched to form the elongated recess to enable ink flow between the manifold 24 and the ink channels 20. In addition, the thick film insulative layer is etched to expose the electrode terminals 32, 37.

A cross sectional view of FIG. 1 is taken along view line 2—2 through one channel and shown as FIG. 2 to show how the ink flows from the manifold 24 and around the end 21 of the groove 20, as depicted by arrow 23, and to show the potential exposure of the heating elements, matrix addressing electrodes, and driving transistors to the ink.

In the preferred embodiment of the present invention, a single side polished (100) silicon wafer has its polished surface 30 coated with an underglaze layer 39, such as silicon dioxide, having a thickness of about 2 µm. Polysilicon heating elements 34 are used and a deposited phosophorous doped composite of thin thermally grown oxide followed by silicon dioxide layer 17 is applied to the polysilicon. For more detailed discussion refer to FIG. 4, discussed later. The oxide layer 17 is typically a thickness of 0.5 to 1 µm to protect and insulate the heating elements from the conductive ink. The oxide is removed from the central portion of the resistor elements, and a composite layer of silicon nitride followed by sputtered tantalum (Ta) 14 is deposited and patterned over the central region of the heating or resistor elements. The tantalum layer is etched off all but the protective layer 17 directly over the heating elements using, for example, $CF_4/O_2$ plasma etching. If a resistive material such as zirconium boride is used for the heating elements, then other suitable well known insulative materials may be used for the protective layer thereover.

Referring to FIG. 2, the monolithic electronic circuitry comprising MOS drivers 48, matrix electrodes 33, and common return 35 is protected from the ink by depositing a silicon dioxide layer 16 having a thickness range of 500 Å to 1 μm, with a preferred thickness of 1000 Å. Next a plasma (silicon) nitride layer 13 is deposited having a thickness range of 2500 Å to 2 μm, with a preferred thickness of 1 μm. The heating element (i.e., the Ta protective layer 14) and the electrode terminals or contact pads 32,37 are cleared of both oxide and nitride. First, the plasma nitride layer is dry etched to expose the silicon dioxide layer, then the silicon dioxide layer is wet etched to remove it from the Ta and contact pads. It has been experimentally determined that roughening the Ta surface leads to shortened heating element lifetime, so that its surface smoothness must be protected by use of a wet etch which does not attack Ta.

The thick film photopatternable insulative layer 18, such as, for example, Riston ®, Vacrel ®, or polyimide is optionally formed over the two ion passivation layers 13, 16 for both additional electronic circuitry passivation and to provide the pits 26 and ink flow path from the reservoir 24 to the ink channels 20. Polyimide, with its resistance to ion penetration and excellent adhesion to silicon nitride is the preferred final passivation layer 18. Other means of providing the flow path indicated by arrow 23 may be by dicing or isotropic etching of the channel plate 31 as taught by U.S. Pat. No. Re. 32,572 mentioned above or by anisotropically etching the heating element plate 28 in the vicinity wall 22 formed between the channels and reservoir when they are subsequently mated as taught by U.S. Pat. No. 4,774,530.

For maximum ionic protection, a third passivating layer 12 of polyimide is deposited over the plasma nitride layer 13 having a thickness range of 1.5 to 12 μm. In the low range of thickness, the heating element pit 26 and communicating passageway 38 are either omitted or the thick film layer 18 must also be added. However, in the high thickness range of 8 μm or greater, the polyimide layer may itself be photopatterned to supply the pit 26 and the passageway 38. The polyimide layer provides increased protection against ionic contamination, for it has modest resistance to ionic penetration in its own right. Further, low electric fields are present in thick polyimide layers. It is the plasma nitride layer which provides the greatest resistance to ion migration, but the silicon dioxide has very high etch selectivity with respect to the Ta protective layer 14 that protects the heating elements against cavitational stress caused by the growth and collapse of the droplet expelling bubbles. Since the adhesion is best between plasma nitride and polyimide, the three layered passivation layers of oxide, nitride, and polyimide, in that order, offers the best protection of the printhead's electronic circuitry against ionic contamination from the ink. Further, if the polyimide is at least 8 μm thick it can be photopatterned to provide the advantageous pit 26 and cost effective fabricating process for providing a means of communication between the reservoir 24 and channels 20 without the addition of a separate thin film layer 18.

Figure 3:
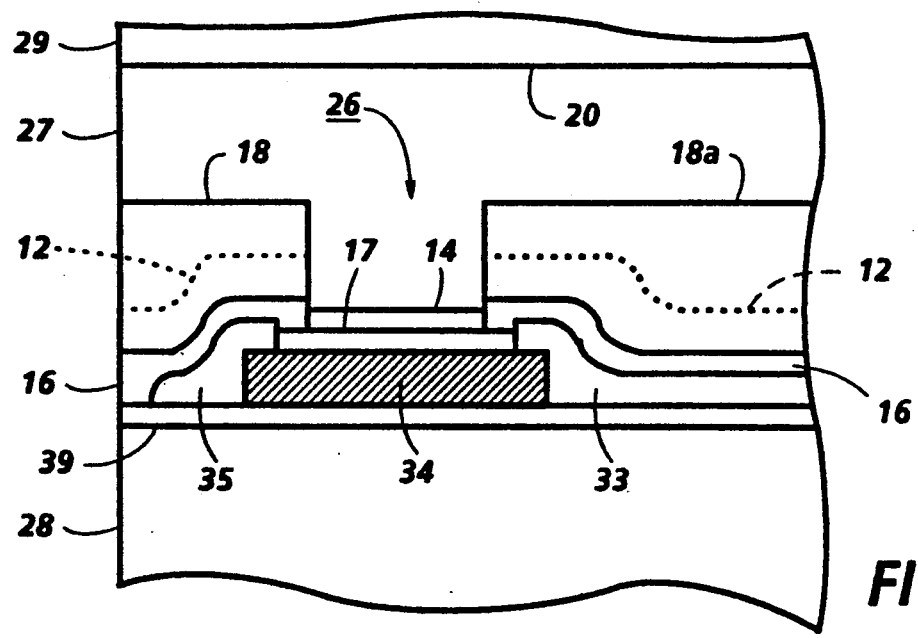
FIG. 3 is an enlarged cross-sectional view of an alternative embodiment of the electrode passivation and heating element in FIG. 2.

In an alternate embodiment shown in FIG. 3, the ionic passivation of the matrix addressing electrodes 33, 35 and MOS transistor switches (not shown) may be accomplished by depositing a doped silicon dioxide layer 16, such as $SiO_2$ doped with a 4 percent by weight phosphorous doped glass (PSG) to a thickness of 500 Å to 1 μm. The doped oxide layer is then overcoated with a layer 12 of polyimide deposited to a thickness of 1.5 to 3 μm, shown in dashed line because it may be further overcoated with a thick film layer 18 or with a second polyimide layer 18a having a thickness of at least 8 μm as in the preferred embodiment. The polyimide may be photo-exposed or patterned through a photoresist to clear the polyimide from the oxide over the Ta layer over the heating elements and over the contact pads. The doped oxide is then cleared from the Ta and contact pads by a wet etch. Optionally, the doped oxide may be patterned prior to the deposition of the polyimide layer. However, the better process would be to apply the layers sequentially and then pattern sequentially because of the need to get good adhesion between layers.

It is important to recognize that the heater plate is a fairly hostile environment for integrated circuits. Commercial ink generally entails a low attention to purity. As a result, the active part of the heater plate will be at elevated temperature adjacent to a contaminated aqueous ink solution which abounds with mobile ions. In addition, it is desirable to run the heater plate at a voltage of 30 to 50 volts, so that there will be a substantial electric field present. Thus, the multi-layered ionic passivation layer of FIGS. 2 and 3 described above provides improved protection for the active devices and provides improved protection resulting in longer operating lifetime for the heater plate.

Figure 4:
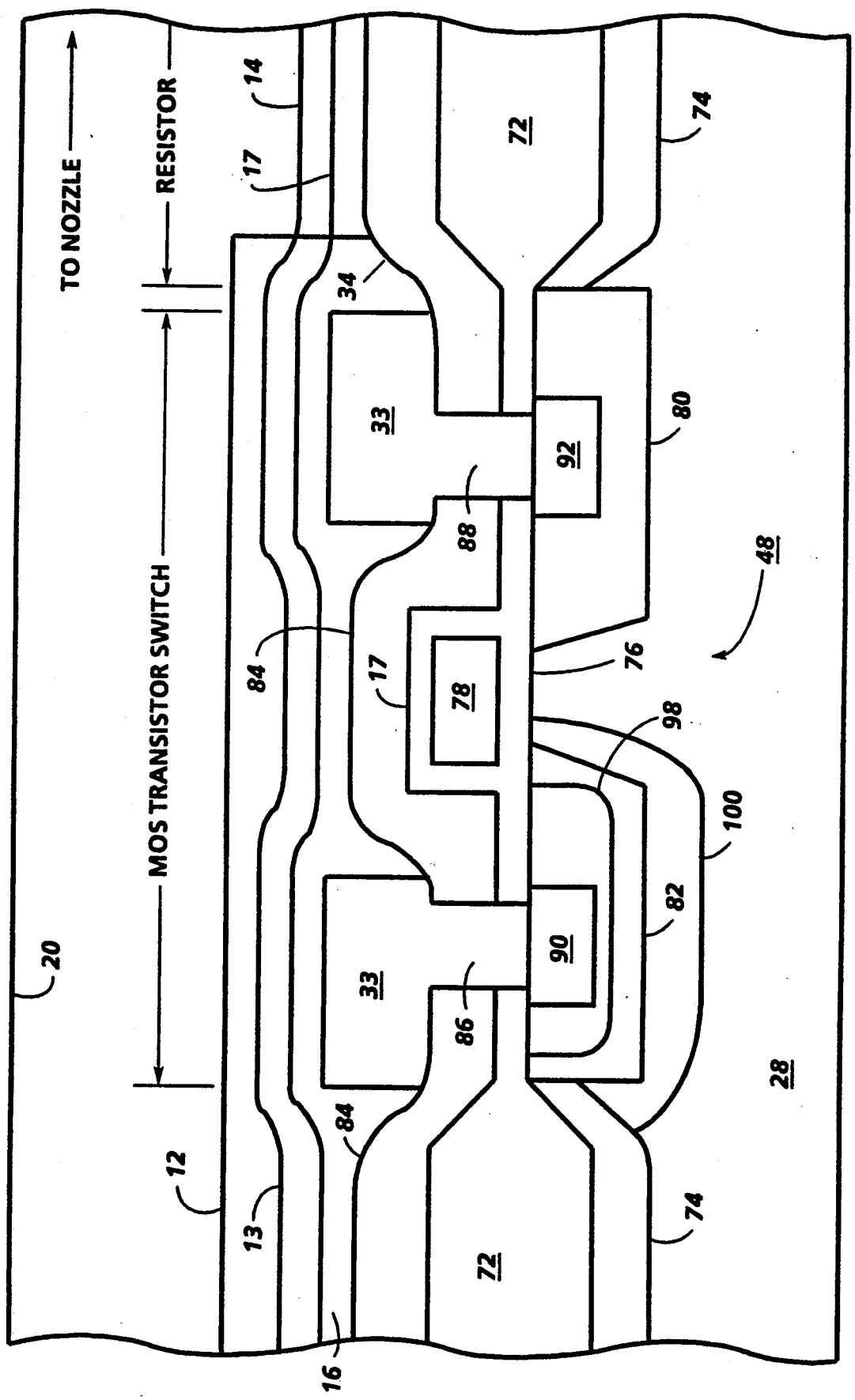
FIG. 4 is an enlarged, cross-sectional view of a typical MOS transistor switch monolithically integrated in the printhead requiring the ionic passivation of the present invention.
Figure 5:
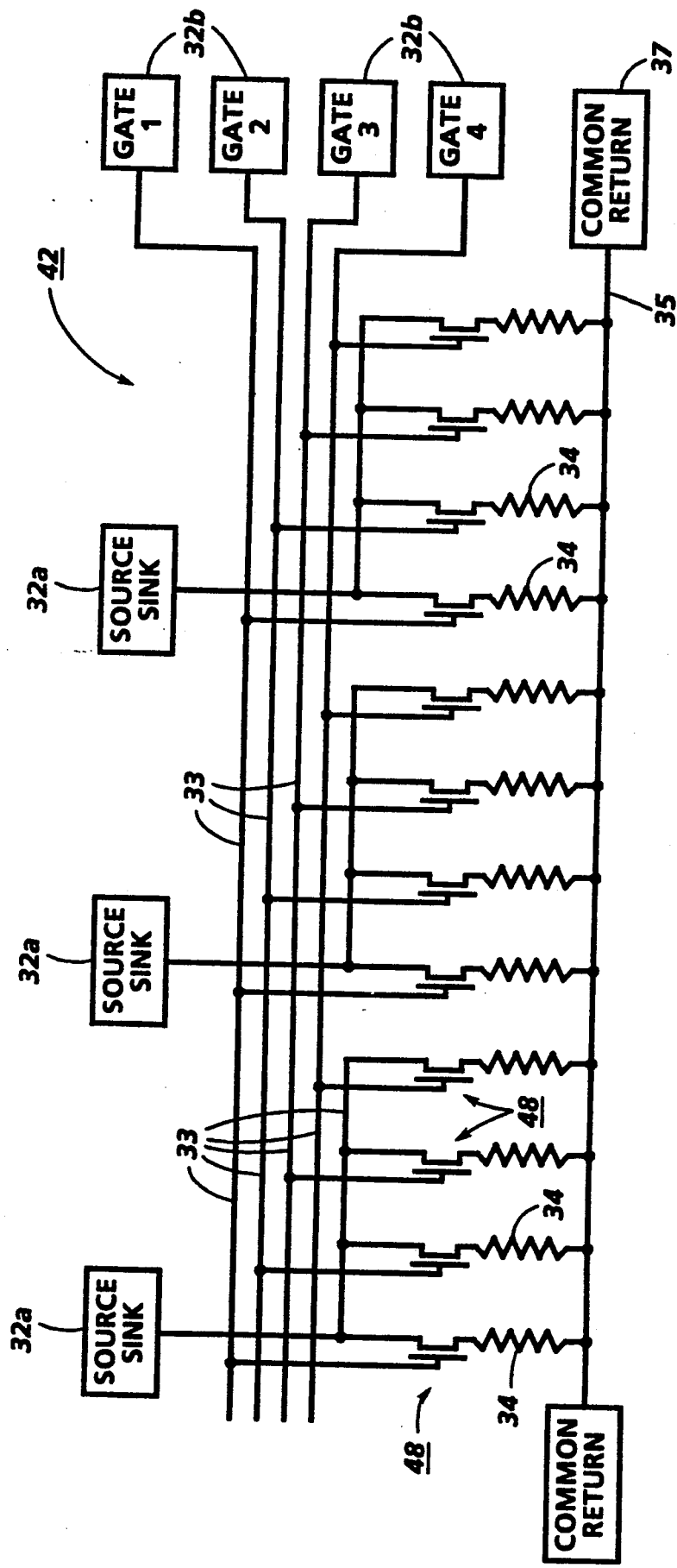
FIG. 5 is a schematic diagram of a matrix address scheme used by the MOS drivers to reduce the number of external electrical interfaces with the printhead controller which supplies the electrical signals.

Referring to FIG. 4, a typical MOS transistor switch 48 and heating element (resistor) 34 are shown in cross section. The transistor switch and heating element are formed by processing a p type silicon substrate wafer or heating element plate 28 by the LOCOS (local oxidation of silicon) process to form a thin $SiO_2$ layer (not shown) followed by deposition of a silicon nitride masking layer (not shown). A photoresist layer (not shown) is applied and patterned over the areas which will form the active enhancement and depletion mode transistor areas. The resist is used to pattern the $Si_3N_4$ layer and then to block a boron implant from the active transistor areas. A channel stop boron implant 74 is aligned to the field oxide areas 72. The photoresist is then removed and the wafers are cleaned in a series of chemical solutions, and heated to a temperature of about 1000° C. Steam is flowed past the wafer to oxidize the surface for several hours and therefore grow field oxide layer 72 to a thickness to at least 1 μm. Silicon surfaces with $Si_3N_4$ and thin $SIO_2$ layers are then removed to leave bare silicon in active areas identified in FIG. 4 as "MOS Transistor Switch". Gate oxide layer 76 is grown in the bare silicon areas, and a single polysilicon layer is deposited to form the transistor gates 78 and resistors 34. The polysilicon layer produces a sheet resistance between $5 \Omega/\square$ and $5 k\Omega/\square$. The polysilicon gates are used to mask ion implantation from the active transistor device channel area, while a lightly doped source 80 and drain 82 implant is formed to produce a sheet resistance of between $500 \Omega/\square$ and $20 k\Omega/\square$ but, preferably, about $4 k\Omega/\square$. The wafer or heating element plate 28 is then cleaned and re-oxidized to form silicon dioxide layer 17 over gate 78 and resistor 34. A phosphorus doped glass layer 84 is then deposited on the thermal oxide layers 17 and 72, and is flowed at high temperatures in order to planarize the surface. Photoresist is applied and patterned to form vias 86 and 88 to drain 82 and source 80, respectively, and to clear the glass from the silicon dioxide layer 17 over the resistors 34. Preferably, the contact areas are heavily doped by n+ ion implants 90, 92 to allow ohmic contact between the lightly doped drain and source layers 82, 80 and aluminum metallization forming the matrix addressing electrodes 33. Following the thermal cycle necessary to activate the heavily doped regions 90, 92, the wafers are cleaned and aluminum metallization is applied to form interconnections with the matrix addressing electrodes 33, thus providing contacts to the source, drain and polysilicon gate regions.

In operation, as a bias is applied to the drain 82, the region around gate 78 becomes depleted of carriers into drain area 82, so that the edge of the depleted region looks similar to the boundaries outlined by lines 98, 100. Because the drain area becomes depleted, the electric field at the junction of gate 78 and drain implant 90 is less severe, so a high voltage can be tolerated before breakdown. By self-aligning the n-drift layer 82 to the polysilicon gate 78, breakdown voltage can be extended up to values greater than 75 volts, compared to a breakdown voltage of approximately 20 volts in the prior art devices.

As described above, field oxide layer 72 is grown so as to exceed a 1 micron thickness. In the standard NMOS process flow described above, field oxide regions $\leq 1.0$ micron thick were grown on the surface of the silicon wafer in areas where transistors will not be formed. This thickness was sufficient to electrically isolate the individual transistors. In a thermal ink jet printing environment, a primary consideration is maintaining a thermally efficient heat dissipation from the resistor area. The resistors are typically heated by 2 $\mu$sec to 10 $\mu$sec electrical heating pulses. The energy required to eject an ink droplet suitable for a 300 spi printing system is 15 $\mu$joules depending on the resistor design efficiency. With the resistor placed on top of the field oxide region, a thermally efficient resistor design will be one that provides low heat conduction from the resistor to the thermally conductive silicon substrate, thus reducing operating power requirements. It has been determined that a thermally efficient system is enabled by forming the oxide layer to a thickness of between 1–4 microns.

As discussed above, a Ta layer 14 is formed over the polysilicon heating element 34 with the thermally grown silicon dioxide layer 17 therebetween for electrical insulation. The ionic passivation of the MOS transistor switches and matrix addressing electrodes is accomplished by sequentially formed multi-layers of silicon dioxide and plasma silicon nitride, with the maximum ionic protection obtained by a third layer of polyimide.

The above MOS transistor switch demonstrates that drivers can be simultaneously fabricated with the resistive transducer elements. The presence of drivers alone allows reduction of interconnection from N connections to $\approx 2\sqrt{N}$ connections. When matrix addressing schemes are utilized such as that described in FIG. 5, wherein a partially shown, electrical diagram of a typical addressing scheme is shown, in which groups of four heating elements 34 have one heating element transistor gate per group addressed by terminals 32b, while the terminal 32a addresses the source sink of all four heating elements in each group. Thus, for example, 50 jets can be addressed by $\approx 15$ connections, and 200 jets can be addressed by $\approx 30$ connections.

Addition of logic circuitry allows for a further reduction in interconnection which becomes important for large arrays. It is possible to address an arbitrarily large number of jets with six or seven electrical connections. NMOS logic circuits can be added by including depletion mode photoresist masking and implant process steps in the fabrication sequence so that normally on and normally off devices are available to form logic gates. The polysilicon which is used to form the resistor elements and gates of drivers is simultaneously used to form the gates of the logic circuit elements.

As disclosed in U.S. Pat. Nos. Re. 32,572, 4,774,530 and 4,638,337, incorporated herein by reference, the channel plate is formed from a two side polished, (100) silicon wafer to produce a plurality of upper substrates 31 for the printhead. After the wafer is chemically cleaned, a pyrolytic CVD silicon nitride layer (not shown) is deposited on both sides. Using conventional photolithography, at least two vias for alignment openings (not shown) at predetermined locations are printed on one wafer side. The silicon nitride is plasma etched off of the patterned vias representing the alignment openings. A potassium hydroxide (KOH) anisotropic etch may be used to etch the alignment openings. In this case, the {111} planes of the (100) wafer make an angle of 54.7 degrees with the surface of the wafer. The alignment openings are about 60 to 80 mils (1.5 to 2 mm) square.

Next, the opposite side of the wafer is photolithographically patterned, using the previously etched alignment holes as a reference to form the relatively large rectangular through recesses 24 and sets of elongated, parallel channel recesses that will eventually become the ink manifolds and channels of the printheads. The surface 36 of the wafer containing the manifold and channel recesses are portions of the original wafer surface (covered by a silicon nitride layer) on which adhesive will be applied later for bonding it to the substrate containing the plurality of sets of heating elements. A final dicing cut, which produces end face 29, opens one end of the elongated grooves 20 producing nozzles 27. The other ends of the channel groove 20 remain closed by ends 21. However, the alignment and bonding of the channel plate to the heater plate places the ends 21 of channels 20 directly over elongated recess 38 in the thick film insulative layer 18 or thick film polyimide layer 12 as shown in FIG. 2 enabling the flow of ink into the channels from the manifold as depicted by arrows 23.

Many modifications and variations are apparent from the foregoing description of the invention, and all such modifications and variations are intended to be within the scope of the present invention.

Since MOS transistor switches are sensitive to mobile ions, such as those found in inks used by thermal ink jet printers, they must be ionically passivated without impacting the printhead design or cost effective fabrication process therefor. In addition, the ionic passivation must be removable from the heating element protective layer without damage thereto.

We claim:

1. An improved ink jet printhead having a plurality of parallel ink flow channels, each of which terminate with an ink droplet emitting nozzle at one end and communicate with an ink supplying reservoir at the other end, a heating element with a cavitational protective layer thereover being located in each channel a predetermined distance upstream from the nozzle, and MOS electronic circuitry monolithically integrated within the printhead for applying electrical pulses to the heating elements to produce bubbles momentarily on the protective layer of the heating element in response thereto, each of said bubbles expelling an ink droplet from the nozzles, wherein the improvement comprises:

ionic passivation of the MOS electronic circuitry through the deposition of a multi-layered, thin film insulative coating thereon consisting of a first layer of doped or undoped silicon dioxide directly over the MOS electronic circuitry and heating elements with protective layer having a thickness of 200 Å to 2 μm followed by a second layer of plasma nitride over the first layer having a thickness of 1000 Å to 3 μm, the silicon nitride being dry etched over the protective layer of the heating elements and electrical contact pads for external connection to electrical power to expose the first layer of silicon oxide, followed by etching of the silicon oxide to remove it from the protective layer and contact pads, whereby the etch sequence prevents both contact pads and the heating element protective layers from being attacked, and the MOS circuitry is concurrently protected from mobile ions in the ink by said multi-layered, ionic passivation, while maintaining the cost effective fabrication of a printhead having heating elements with a cavitational protective layer to enhance their life time.

2. The improved printhead of claim 1, wherein a photopatternable, thick film layer is deposited and patterned on the silicon nitride second layer of the multi-layered, ionic passivation of the electronic circuitry, the thick film layer having a thickness of at least 8 μm and being patterned to provide heating element pits for bubble containment and an ink flow passage between the reservoir and channels.

3. The improved printhead of claim 1, wherein the multi-layered insulative coating further consists of a third layer of polyimide having a thickness of at least 1.5 μm and being etched from the heating elements and contact pads, the polyimide layer providing additional resistance to ionic contamination and lower electric fields therein, while providing an insulative layer having excellent adhesion to the plasma nitride.

4. The improved printhead of claim 3, wherein the thickness of the polyimide layer is at least 8 μm, so that it provides a pit for the heating elements to aid in the suppression of ingestion of air during droplet expulsion and an ink flow passage from the ink reservoir to the ink channels, so that a separate, subsequent thick film layer is not required to provide the heating element pits and ink flow passage between the reservoir and channels.

5. The improved printhead of claim 3, wherein a photopatternable, thick film layer is deposited and patterned on the polyimide third layer of the multi-layered, ionic passivation of the electronic circuitry, the thick film layer having a thickness of at least 8 μm and being patterned to provide a bubble containing pit for each heating element and an ink flow passage between the reservoir and channels.

6. The improved printhead of claim 3, wherein the third layer of the multi-layered insulative coating comprises two polyimide layers instead of a single layer, a first polyimide layer being applied to the silicon nitride second layer and having a thickness of at least 1.5 μm, and a second polyimide layer having a thickness of at least 8 μm and patterned over the heating elements to provide pits for bubble containment and between the reservoir and channels to provide an ink flow passage from the reservoir to the channels, while the first polyimide layer remains intact to maintain a three layer passivation comprising polyimide, silicon nitride, and silicon dioxide optionally doped with phosphorus, so that maximum ionic passivation of the electronic circuitry is provided from the ink.

* * * * *